United States Patent
Le

(10) Patent No.: US 11,271,374 B2
(45) Date of Patent: Mar. 8, 2022

(54) VENTILATION AND HEAT DISSIPATION BOX-TYPE SUBSTATION

(71) Applicant: NINGBO GONGSHENG ELECTRIC TECHNOLOGY CO., LTD, Zhejiang Province (CN)

(72) Inventor: Chaohua Le, Zhejiang Province (CN)

(73) Assignee: NINGBO GONGSHENG ELECTRIC TECHNOLOGY CO., LTD., Ningbo (CN)

(*) Notice: Subject to any disclaimer, the term of this patent is extended or adjusted under 35 U.S.C. 154(b) by 0 days.

(21) Appl. No.: 17/091,923

(22) Filed: Nov. 6, 2020

(65) Prior Publication Data

US 2021/0203138 A1 Jul. 1, 2021

(51) Int. Cl.
*H05K 7/20* (2006.01)
*H02B 7/00* (2006.01)
*E04H 5/04* (2006.01)
*H02B 1/56* (2006.01)

(52) U.S. Cl.
CPC .......... *H02B 1/56* (2013.01); *E04H 5/04* (2013.01); *H02B 7/00* (2013.01); *H05K 7/20136* (2013.01)

(58) Field of Classification Search
CPC .......... H02B 7/00; H02B 7/06; E04H 5/04
See application file for complete search history.

(56) References Cited

U.S. PATENT DOCUMENTS 4,609,126 A * 9/1986 Janda ............... H02B 7/06
174/16.1

FOREIGN PATENT DOCUMENTS

| CN | 203103801 U | * | 7/2013 | |
|----|-------------|---|--------|---|
| CN | 203466458 U | * | 3/2014 | |
| CN | 203466459 U | * | 3/2014 | |
| CN | 205407046 U | * | 7/2016 | |
| CN | 211351451 U | * | 8/2020 | |
| CN | 211556642 U | * | 9/2020 | |
| CN | 213151446 U | * | 5/2021 | |
| CN | 213584884 U | * | 6/2021 | |
| CN | 214626027 U | * | 11/2021 | |
| DE | 2618200 A1 | * | 11/1977 | ............... E04H 5/04 |

\* cited by examiner

*Primary Examiner* — Robert J Hoffberg
(74) *Attorney, Agent, or Firm* — Tarolli, Sundheim, Covell & Tummino LLP

(57) ABSTRACT

The present patent discloses a ventilation and heat dissipation box-type substation, which includes a substation box and a substation box roof, and the surroundings of the substation box roof located on the outside of the substation box and not higher than the height of the top of the substation box. The substation box is provided with a return air inlet, and the inside of the substation box roof is provided with an inner top plate that collects the heat in the substation box. A circulation fan is arranged on the top of the inner top plate and forms a circulation cavity with the substation box roof, and one end of the circulation cavity away from the circulation fan is connected with the outside of the substation box. The present patent effectively avoids the accumulation of heat, which affects the service life of electronic components.

5 Claims, 3 Drawing Sheets

VENTILATION AND HEAT DISSIPATION BOX-TYPE SUBSTATION

RELATED APPLICATIONS

The present invention is a Nonprovisional Application under 35 USC 111(a), claiming priority to Serial No. CN 201922498089.X, filed on 31 Dec. 2019, the entirety of which is incorporated herein by reference.

TECHNICAL FIELD

The patent relates to the technical field of substation equipment, more specifically relates to a ventilation and heat-dissipation box-type substation.

BACKGROUND ART

Box-type substation is also called prefabricated power transformer or prefabricated substation. It is a kind of high-voltage switchgear, distribution transformer and low-voltage power distribution device. It is an integrated factory-prefabricated indoor and outdoor compact type power distribution equipment arranged according to a certain wiring scheme. It organically combines functions such as transformer step-down and low-voltage power distribution. It is installed in a moisture-proof, rust-proof, dust-proof, rodent-proof, fire-proof, anti-theft, heat-insulating, fully enclosed, and movable steel structure box. It is especially suitable for urban network construction and transformation. It is a brand-new substation after the traditional type civil substations.

The Chinese patent of publication number CN107706766A discloses a box substation, which includes a shell, wherein the shell comprises a base and a shell body, and the base is provided with a drainage structure, and the shell body is provided with a drainage structure, the drainage structure is able to drain the condensed water in the main body of the shell into the base and discharged from the box substation along the drainage structure; and an electrical component assembly, which includes breaking devices, transformers and isolation devices, and is installed in the shell.

However, it is difficult for the box substation to effectively remove the hot air from the inside of the shell during application, which in turn causes heat to accumulate in the shell of the box substation and affects the service life of the electronic component assembly, and this needs to be improved.

SUMMARY OF THE INVENTION

In view of the shortcomings of the prior art, the purpose of the present patent is to provide a ventilation and heat dissipation box-type substation, which has the effect of avoiding heat accumulation which affects the service life of electronic components.

In order to achieve the above purpose, the present patent provides the following technical solutions:

A ventilation and heat dissipation box-type substation, which includes a substation box and a substation box roof erected on top of the substation box, and the surroundings of the substation box roof located on the outside of the substation box and not higher than the height of the top of the substation box. The substation box is provided with a return air inlet, and the inside of the substation box roof is provided with an inner top plate that collects the heat in the substation box. A circulation fan is arranged on the top of the inner top plate and forms a circulation cavity with the substation box roof, and one end of the circulation cavity away from the circulation fan is connected with the outside of the substation box.

By adopting the above technical solution, the return air inlet is used for the air outside the substation box to flow into the substation box. When the density of heat in the air decreases due to thermal expansion and contraction, the hot air rises and is collected by the inner top plate, and when the circulation fan is turned on, the air with a large amount of heat collected by the inner top plate will enter the circulation cavity and finally discharged to the outside of the substation box, so as to effectively avoid heat accumulation which affects the service life of electronic components.

The patent is further arranged as: the inner top plate is inclined and the height of one end close to the circulation fan is higher than that of the other end.

By adopting the above technical solution, the inclined inner top plate serves the function of guiding heat to flow to the circulation fan, and improves the heat dissipation effect of the box-type substation.

The patent is further arranged as: the inner top plate is connected with an inclined deflector plate, wherein the inclination angle between the inner top plate and the horizontal plane is greater than 0° and smaller than 30°, and the inclination angle between the inclined deflector plate and the horizontal plane is smaller than 60° and greater than the inclination angle between the inner top plate and the horizontal plane.

By adopting the above technical solution, the inclined deflector plate and the inner top plate cooperate and serve the function of further guiding heat to flow to the circulation fan, and improves the heat dissipation effect of the box-type substation.

The patent is further arranged as: a downward opening is formed between the surrounding of the substation box roof and the outer side wall of the substation box.

By adopting the above technical solution, the downward opening plays a role in preventing debris from entering the circulation cavity, and at the same time, it effectively prevents rainwater from entering and affecting the electrical safety of the box-type substation.

The patent is further arranged as: an air outlet plate is arranged at the opening.

By adopting the above technical solution, the air outlet plate plays a further blocking role, preventing animals from entering the box-type substation through the opening and affecting the safety of the box-type substation.

The patent is further arranged as: the top of the substation box is provided with a plurality of box connectors, and the lower side of the substation box roof is provided with a plurality of box roof sleeves matching the box connectors, the box roof sleeves are provided with box roof connectors, and the box connectors are inserted into the box roof sleeves and abut the box roof connectors, and the box roof connectors are elastic in nature.

By adopting the above technical solution, after the box connectors are inserted into the box roof sleeves, they play a role of connecting the substation box and the substation box roof, and then under the action of the elastic box roof connectors, the ability of box-type substation to resist wind and vibration is improved, thereby significantly extending the service life of the box-type substation.

The patent is further arranged as: a refrigeration element is arranged in the circulation cavity.

By adopting the above technical solution, the refrigeration element plays a role of condensing the water vapor in the hot air, which is converted into liquid state water and adhered on the inner top plate and inclined deflector plate, and discharged through the opening under the guidance of the inner top plate and the inclined deflector plate, and the purpose of further dissipating the heat in the box-type substation is achieved.

In summary, the present patent has the following beneficial effects: the air with a large amount of heat collected by the inner top plate will enter the circulation cavity and discharged through the circulation fan, so as to effectively avoid the accumulation of heat which affects the service life of electronic components.

DESCRIPTION OF ACCOMPANIED FIGURES

Figure 1:
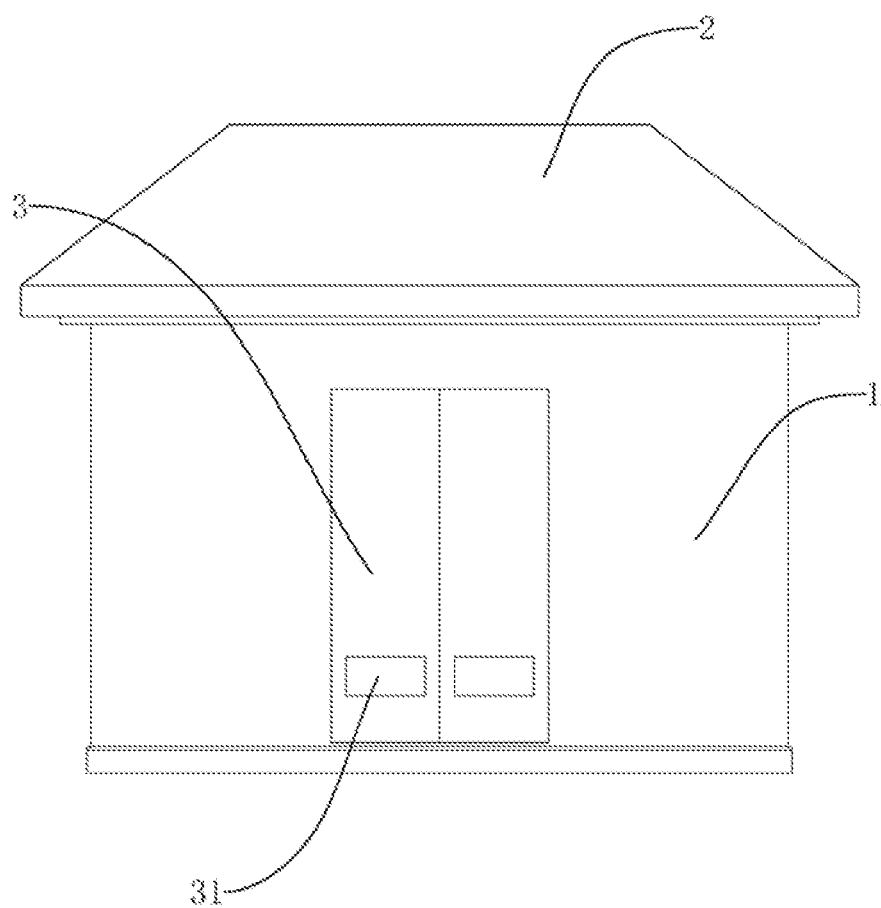
FIG. 1 is a schematic front view diagram of the structure of this embodiment.

The corresponding reference numeral parts in the accompanied figures are: 1. Substation box; 11. Box connectors; 2. Substation box roof; 21. Inner top plate; 22. Circulation cavity; 23. Inclined deflector plate; 24. Box roof sleeves; 3. Substation box door; 31. Return air inlet; 4. Circulation fan; 5. Box roof connector; 6. Air outlet plate

DETAILED IMPLEMENTATION METHOD

In order to make the technical solutions and advantages of the present patent clearer, the present patent will be further described in detail below in conjunction with the accompanied figures.

As shown in FIG. 1, a ventilation and heat dissipation box-type substation, which includes a substation box 1 and a substation box roof 2 erected on top of the substation box 1. The surroundings of the substation box roof 2 located on the outside of the substation box 1 and not higher than the height of the top of the substation box 1. The substation box 1 is provided with a substation box door 3, and the substation box door 3 is provided with a return air inlet 31. The return air inlet 31 serves the function of making the gas outside the substation box 1 to flow into the substation box 1.

Figure 2:
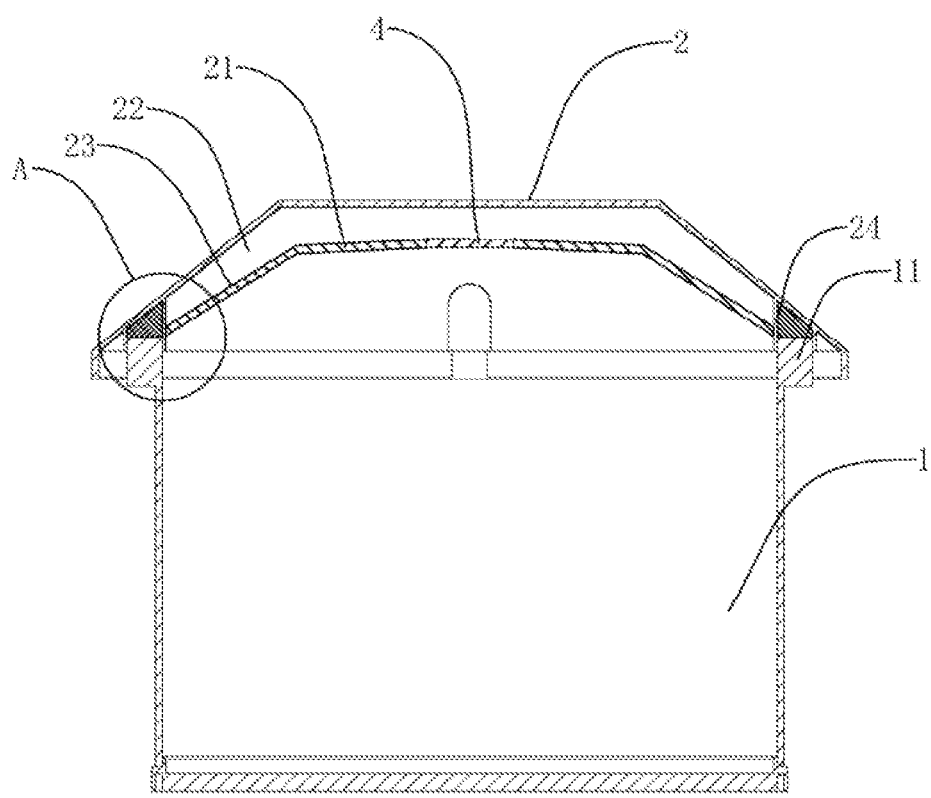
FIG. 2 is a schematic sectional view diagram of the structure of this embodiment.
Figure 3:
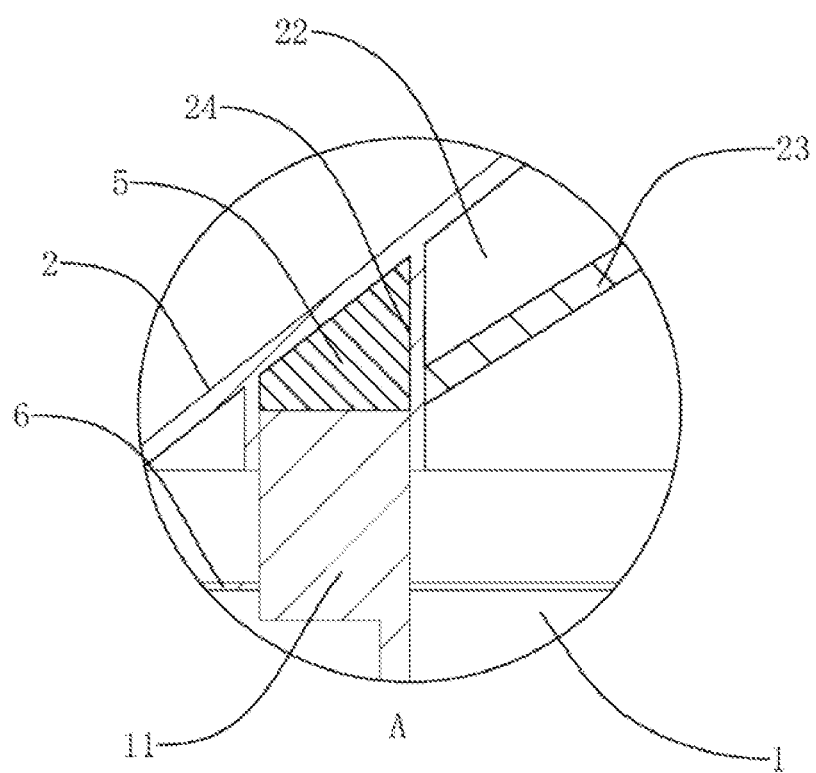
FIG. 3 is a schematic diagram of an enlarged structure of part A in FIG. 2.

As shown in FIG. 2 and FIG. 3, the inside of the substation box roof 2 is provided with an inner top plate 21 that collects the heat in the substation box 1. A circulation fan 4 is arranged on the top of the inner top plate 21 and forms a circulation cavity 22 with the substation box roof 2. One end of the circulation cavity 22 away from the circulation fan 4 is connected with the outside of the substation box. When the density of heat in the air decreases due to thermal expansion and contraction, the hot air rises and is collected by the inner top plate 21, and when the circulation fan 4 is turned on, the air with a large amount of heat collected by the inner top plate 21 will enter the circulation cavity 22 and finally discharged to the outside of the substation box, so as to effectively avoid heat accumulation which affects the service life of electronic components.

It is necessary to mention that, the inner top plate 21 is inclined and the height of one end close to the circulation fan 4 is higher than that of the other end, so as the inclined inner top plate 21 serves the function of guiding heat to flow to the circulation fan 4, and improves the heat dissipation effect of the box-type substation. Meantime, the inner top plate 21 is connected with an inclined deflector plate 23, wherein the inclination angle between the inner top plate 21 and the horizontal plane is greater than 0° and smaller than 30°, and the inclination angle between the inclined deflector plate 23 and the horizontal plane is smaller than 60° and greater than the inclination angle between the inner top plate 21 and the horizontal plane. The inclined deflector plate 23 and the inner top plate 21 cooperate and serve the function of further guiding heat to flow to the circulation fan 4, and improves the heat dissipation effect of the box-type substation. It has to mention that, a refrigeration element is arranged in the circulation cavity 22. The refrigeration element plays a role of condensing the water vapor in the hot air, which is converted into liquid state water and adhered on the inner top plate 21 and inclined deflector plate 23, and discharged through the opening under the guidance of the inner top plate 21 and the inclined deflector plate 23, and the purpose of further dissipating the heat in the box-type substation is achieved.

As shown in FIG. 2 and FIG. 3, a downward opening is formed between the surrounding of the substation box roof 2 and the outer side wall of the substation box 1. And an air outlet plate 6 is arranged at the opening. Therefore, the setting up of a downward opening plays a role in preventing debris from entering the circulation cavity 22, and at the same time, it effectively prevents rainwater from entering and affecting the electrical safety of the box-type substation, and the air outlet plate 6 plays a further blocking role, preventing animals from entering the box-type substation through the opening and affecting the safety of the box-type substation. The top of the substation box 1 is provided with a plurality of box connectors 11. The lower side of the substation box roof 2 is provided with a plurality of box roof sleeves 24 matching the box connectors 11. The box roof sleeves 24 are provided with box roof connectors 5 which are elastic in nature. The box connectors 11 are inserted into the box roof sleeves 24 and abut the box roof connectors 5. When the box connectors 11 are inserted into the box roof sleeves 24, they play a role of connecting the substation box 1 and the substation box roof 2, and then under the action of the elastic box roof connectors 5, the ability of box-type substation to resist wind and vibration is improved, thereby significantly extending the service life of the box-type substation.

The above are only preferred embodiments of the present patent, and the protection scope of the present patent is not limited to the above embodiments, but all technical solutions under the idea of the present patent belong to the protection scope of the present patent. It should be pointed out that for those of ordinary skill in the art, several modifications and changes made without departing from the principles of the present patent should also be regarded as the protection scope of the present patent.

What is claimed:

1. A ventilation and heat dissipation box-type substation, which includes a substation box and a substation box roof erected on a top of the substation box, and a perimeter of the substation box roof located on an outside of the substation box and not higher than a height of the top of the substation box, characterized by, the substation box is provided with a return air inlet, and an inside of the substation box roof is provided with an inner top plate that collects heat in the substation box, a circulation fan is arranged on a top of the inner top plate and forms a circulation cavity with the substation box roof, and one end of the circulation cavity away from the circulation fan is connected with the outside of the substation box, further characterized by the inner top plate is inclined and a height of one end of the inner top plate close to the circulation fan is higher than that of another end of the inner top plate and the inner top plate is connected with an inclined deflector plate, and an inclination angle between the inner top plate and a horizontal plane is greater than 0° and smaller than 30°, and an inclination angle between the inclined deflector plate and the horizontal plane is smaller than 60° and greater than the inclination angle between the inner top plate and the horizontal plane.

2. The ventilation and heat dissipation box-type substation according to claim 1, characterized by, a downward opening is formed between the perimeter of the substation box roof and an outer side wall of the substation box.

3. The ventilation and heat dissipation box-type substation according to claim 2, characterized by, an air outlet plate is arranged at the downward opening.

4. The ventilation and heat dissipation box-type substation according to claim 2, characterized by, the top of the substation box is provided with a plurality of box connectors, and a lower side of the substation box roof is provided with a plurality of box roof sleeves matching the box connectors, the box roof sleeves are provided with box roof connectors, and the box connectors are inserted into the box roof sleeves and abut the box roof connectors, and the box roof connectors are elastic in nature.

5. The ventilation and heat dissipation box-type substation according to claim 2, characterized by, a refrigeration element is arranged in the circulation cavity.

\* \* \* \* \*